(12) United States Patent
Li et al.

(10) Patent No.: US 11,536,368 B2
(45) Date of Patent: Dec. 27, 2022

(54) WATERPROOF ASSEMBLY AND DISPLAY SCREEN

(71) Applicant: UNILUMIN GROUP CO., LTD, Guangdong (CN)

(72) Inventors: Qinglun Li, Guangdong (CN); Kuang Yang, Guangdong (CN); Pinglin Zhao, Guangdong (CN)

(73) Assignee: UNILUMIN GROUP CO., LTD, Shenzhen (CN)

( * ) Notice: Subject to any disclaimer, the term of this patent is extended or adjusted under 35 U.S.C. 154(b) by 347 days.

(21) Appl. No.: 16/747,563

(22) Filed: Jan. 21, 2020

(65) Prior Publication Data

US 2020/0340585 A1 Oct. 29, 2020

(30) Foreign Application Priority Data

Apr. 24, 2019 (CN) .......................... 201920570288.4

(51) Int. Cl.
*F16J 15/10* (2006.01)
*H05K 5/06* (2006.01)
*F16J 15/06* (2006.01)

(52) U.S. Cl.
CPC .......... *F16J 15/104* (2013.01); *F16J 15/061* (2013.01); *H05K 5/061* (2013.01); *H05K 5/063* (2013.01)

(58) Field of Classification Search
CPC .......... F16J 15/10; F16J 15/104; F16J 15/106; F16J 15/061; F16J 15/06; H05K 5/061; H05K 5/163
See application file for complete search history.

(56) References Cited

FOREIGN PATENT DOCUMENTS

| CN | 104900159 A | * | 9/2015 |
| CN | 204680330 U | | 9/2015 |
| CN | 204884445 U | | 12/2015 |
| CN | 207833816 U | | 9/2018 |

OTHER PUBLICATIONS

Communication pursuant to Rules 70(2) and 70a(2) EPC and reference to Rule 39(1) EPC in counterpart European application No. 20155566.1, dated Nov. 2, 2020.

* cited by examiner

*Primary Examiner* — Gilbert Y Lee (57) ABSTRACT

Disclosed is a waterproof substrate, including: two mounting surfaces disposed facing away from each other; and at least one waterproof protrusion provided on at least one of the two mounting surfaces and including: a protrusion body connected with the mounting surface, and one end of the protrusion body away from the waterproof substrate includes a connecting end surface; and at least two waterproof ribs, and each of the waterproof ribs is provided on the connecting end surface respectively and is gradually inclined outwardly in a direction away from the connecting end surface respectively.

12 Claims, 7 Drawing Sheets

WATERPROOF ASSEMBLY AND DISPLAY SCREEN

FIELD

The present application relates to the technical field of waterproof of a display screen, in particular to a waterproof assembly and a display screen.

BACKGROUND

A waterproof rubber ring is usually installed at the interface between the module of the display screen and the socket of the cabinet, and the module and the cabinet are fixed by screws to tightly compress the waterproof rubber ring to achieve waterproof effect. Compared with other module fixing methods (screw fixing, etc.), magnetic suction method is not stable enough to fix the module and the cabinet. When the ordinary waterproof rubber ring is applied, if the waterproof rubber ring is relatively thick, the thrust force acting on the module when the waterproof rubber ring is pressed is greater than the magnet's suction force, which causes the module to be unstable, and a gap may be exist, so as to affect the waterproof effect. If the waterproof rubber ring is relatively thin, a gap may be exist at the compression portion, as a result, the waterproof effect is poor.

SUMMARY

Based on which, it is necessary to provide a waterproof assembly and a display screen, aiming at solving the problem that the thick or thin waterproof rubber ring of the display module fixed by magnetic suction will cause a gap between the waterproof rubber ring and the module, resulting in poor waterproof effect.

A waterproof assembly includes:

a waterproof substrate, including: two mounting surfaces disposed facing away from each other; and at least one waterproof protrusion provided on at least one of the two mounting surfaces and including:

a protrusion body connected with the mounting surface, and one end of the protrusion body away from the waterproof substrate includes a connecting end surface; and at least two waterproof ribs, and each of the waterproof ribs is provided on the connecting end surface respectively and is gradually inclined outwardly in a direction away from the connecting end surface respectively.

In one embodiment, a number of the waterproof protrusion is at least two.

In one embodiment, the waterproof ribs are evenly distributed on the connecting end surface respectively.

In one embodiment, a number of the waterproof ribs is two; and a distance between the two waterproof ribs gradually increases in the direction away from the connecting end surface.

In one embodiment, the two waterproof ribs are arranged symmetrically.

In one embodiment, the protrusion body and the waterproof ribs are both ring-shaped structures.

In one embodiment, a plurality of the waterproof protrusions extending in a same direction are provided on the same mounting surface of the waterproof substrate, and the plurality of the waterproof protrusions are arranged in ring shapes from inside to outside.

In one embodiment, the waterproof ribs, the at least one waterproof protrusion and the waterproof substrate are integrally formed.

In one embodiment, the waterproof assembly further includes at least one waterproof protrusion strip provided on at least one of the two mounting surfaces of the waterproof substrate, and the waterproof protrusion strip is spaced from the protrusion body.

The present application further provides a display screen, including a cabinet and a display module connected with the cabinet, and an installation space is defined between the display module and the cabinet. The display screen further includes the waterproof assembly according to any one of the above embodiments. The waterproof assembly is disposed in the installation space. At least one mounting surface of the mounting surface of the waterproof substrate facing the cabinet and the mounting surface of the waterproof substrate facing the display module includes the at least one waterproof protrusion. At least one of the cabinet and the display module is abutted against the waterproof ribs.

In one embodiment, the mounting surface of the waterproof substrate facing the display module includes the at least one waterproof protrusion. The display module is abutted against the waterproof ribs. The mounting surface of the waterproof substrate facing away from the at least one waterproof protrusion is abutted against the cabinet.

In one embodiment, the mounting surface of the waterproof substrate facing the cabinet includes the at least one waterproof protrusion. The cabinet is abutted against the waterproof ribs. The mounting surface of the waterproof substrate facing away from the at least one waterproof protrusion is abutted against the display module.

In one embodiment, the mounting surface of the waterproof substrate facing the cabinet and the mounting surface of the waterproof substrate facing the display module are respectively provided with the at least one waterproof protrusion. The waterproof ribs provided on one mounting surface of the waterproof substrate is abutted against the display module. The waterproof ribs provided on the other mounting surface of the waterproof substrate is abutted against the cabinet.

In one embodiment, at least one of the cabinet and the display module defines an embedded slot, and the waterproof assembly is embedded in the embedded slot.

In one embodiment, the display module includes a data interface. The waterproof substrate is a ring-shaped structure and surrounds the data interface.

In one embodiment, a surface of the cabinet in contact with the at least one waterproof protrusion is defined as a first abutting surface. A surface of the display module in contact with the at least one waterproof protrusion is defined as a second abutting surface. At least one of the first abutting surface and the second abutting surface is inclined with respect to the mounting surface.

In one embodiment, the first abutting surface and the second abutting surface are inclined with respect to the mounting surface respectively.

In one embodiment, a surface of the cabinet in contact with the at least waterproof protrusion is defined as a first abutting surface. A surface of the display module in contact with the at least one waterproof protrusion is defined as a second abutting surface. At least one of the first abutting surface and the second abutting surface is inclined with respect to the mounting surface.

In one embodiment, the waterproof ribs are evenly distributed on the connecting end surface respectively.

In one embodiment, a number of the waterproof ribs is two. A distance between the two waterproof ribs gradually increases in the direction away from the connecting end surface.

According to the above-mentioned waterproof assembly and display screen, a waterproof assembly is provided between the cabinet of the display screen and the display module of the display screen. The waterproof protrusion is easily deformed relative to the waterproof substrate. When the deformation is large, the waterproof effect is better, so that sealing and waterproof effects may be achieved by squeezing the waterproof protrusion and the display module, or squeezing the waterproof protrusion and cabinet, instead of squeezing the waterproof substrate and the display module, or squeezing the waterproof substrate and the cabinet. So, there is no need to use a waterproof rubber ring with thickness similar to the waterproof substrate or even larger than the waterproof substrate as a waterproof assembly. As a result, the reverse thrust of the waterproof assembly on the cabinet or the display module is reduced, which facilitates tightly compressing the cabinet and the display module, and ensures the stability of the connection between the cabinet and the display module. Especially when the cabinet and the display module are connected by means of magnetic attraction, the reverse thrust of the waterproof protrusion on the cabinet or the display module is very small, which will not damage the magnetic attraction between the cabinet and the display module. Since it can be sealed and waterproofed only by the waterproof protrusion, the thickness of the waterproof substrate may be made relatively small, and there is no need to worry about the problem of poor waterproof effect due to a gap existed at the compression portion because of the insufficient thickness of the waterproof rubber ring. As a result, materials may be saved and manufacturing cost may be reduced, thereby ensuring the sealing and waterproof effects. In addition, at least two mutually spaced waterproof ribs are provided on the connecting end surface of the protrusion body, and each of the waterproof ribs is inclined outwardly relative to the end surface of the protrusion body, so that when the waterproof ribs are squeezed, the waterproof ribs may be further inclined outwardly. When the squeezing force is relatively large, the protrusion body may also be squeezed. Since the waterproof ribs are squeezed to be further inclined in a direction away from each other, it may ensure that the entire waterproof protrusion is squeezed smoothly, so that the protrusion body will not be bent, namely, the waterproof protrusion will not be wrinkled, so that there will not be a gap between the display module and the cabinet, and the sealing and waterproof effects of the waterproof assembly will not be affected.

BRIEF DESCRIPTION OF THE DRAWINGS

In order to explain the technical solutions in the embodiments of the present application or the prior art more clearly, the drawings used in the description of the embodiments or the prior art will be briefly introduced below. Obviously, the drawings in the following description are merely some embodiments of the present application. For those of ordinary skill in the art, other drawings can be obtained based on the structure shown in these drawings without creative labor.

The implementation, functional features and advantages of the present application will be further described with reference to the accompanying drawings.

DETAILED DESCRIPTION OF THE EMBODIMENTS

In order to facilitate understanding of the present application, a more comprehensive description of the waterproof assembly and the display screen will be given below with reference to the related drawings. Preferred embodiments of the waterproof assembly and the display are shown in the drawings. However, the waterproof assembly and the display screen may be implemented in many different forms and are not limited to the embodiments described herein. On the contrary, the purpose of providing these embodiments is to make the disclosure of the waterproof assembly and the display screen more thorough and comprehensive.

It should be noted that when an element is referred to as being "fixed" to another element, it may be directly on the other element or intervening elements may also be present. When an element is considered to be "connected" to another element, it may be directly connected to the other element or intervening elements may also be present. The terms "vertical", "horizontal", "left", "right" and similar expressions used herein are for illustrative purposes only and are not meant to be the only implementations.

Unless defined otherwise, all technical and scientific terms used herein have the same meaning as commonly understood by one of ordinary skill in the art to which this application belongs. The terms used in the description of the waterproof assembly and the display screen herein are only for the purpose of describing specific embodiments, and are not intended to limit the present application. The term "and/or" as used herein includes any and all combinations of one or more of the associated listed items.

In one embodiment, a waterproof substrate 10, including: two mounting surfaces 110 disposed facing away from each other; and a waterproof protrusion 200 provided on at least one of the two mounting surfaces 110 and including: a protrusion body 210 connected with the mounting surface 110, and one end of the protrusion body 210 away from the waterproof substrate 100 includes a connecting end surface 211; and at least two waterproof ribs 220, and each of the waterproof ribs 220 is provided on the connecting end surface 211 respectively and is gradually inclined outwardly in a direction away from the connecting end surface 211 respectively.

Figure 1:
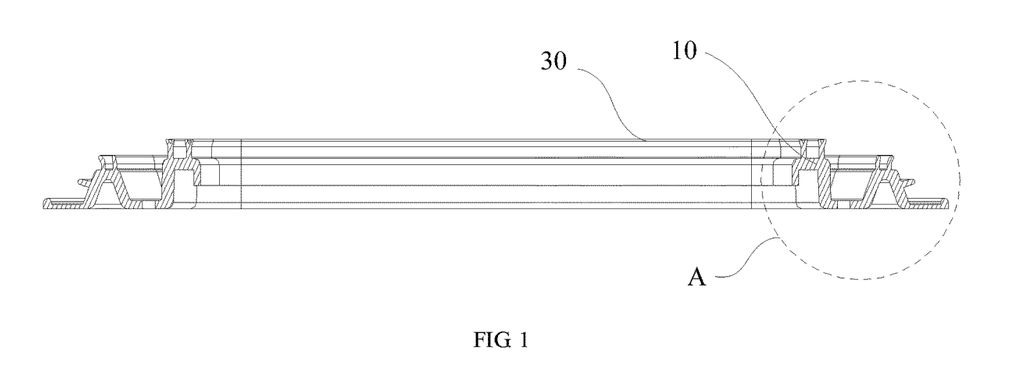
FIG. 1 is a schematic structural view of a waterproof assembly according to an embodiment.
Figure 2:
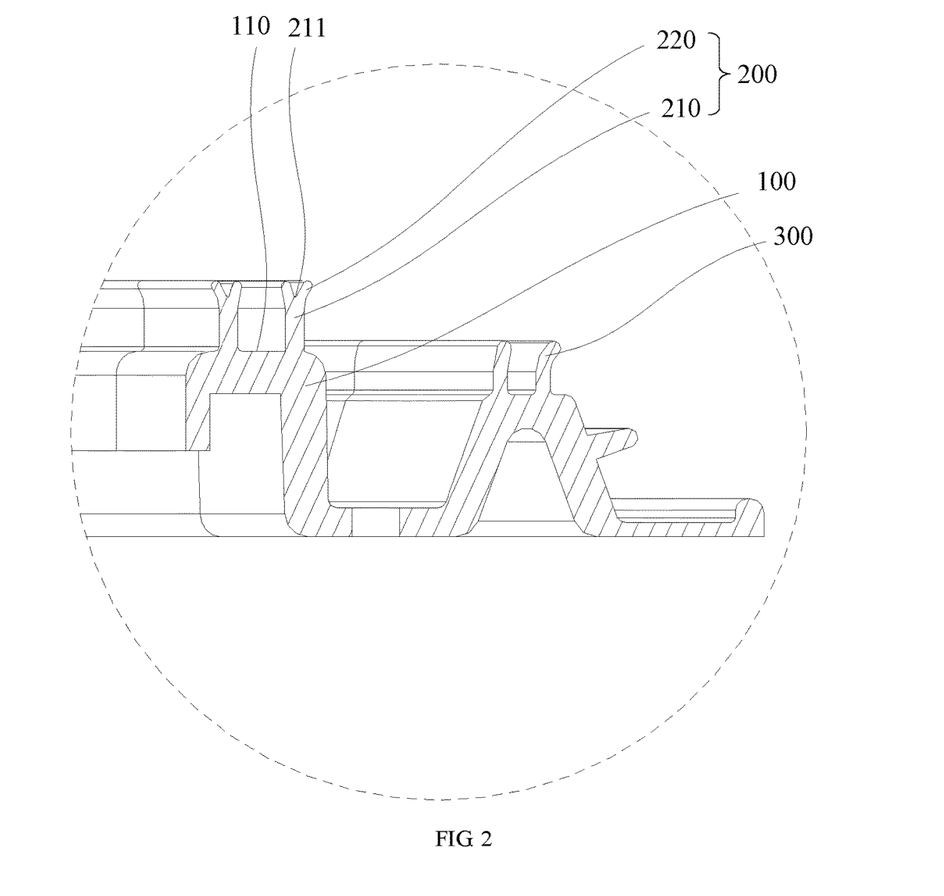
FIG. 2 is a partially enlarged schematic view of a portion A of the waterproof assembly shown in FIG. 1.

As shown in FIG. 1 and FIG. 2, according to an embodiment, a waterproof assembly 10 includes a waterproof substrate 100, which includes two mounting surfaces 110 disposed facing away from each other. Waterproof protrusions 200 are provided on at least one mounting surface 110 of the waterproof substrate 100. The waterproof protrusion includes a protrusion body 210 and at least two waterproof ribs 220. The protrusion body 210 is connected with the mounting surface 110. One end of the protrusion body 210 away from the waterproof substrate 100 includes a connecting end surface 211, and each waterproof rib 220 is provided on the connecting end surface 211 respectively and is gradually inclined outwardly in a direction away from the connecting end surface 211 respectively, namely, a distance between the two waterproof ribs 220 gradually increases in the direction away from the connecting end surface 211. In this embodiment, a size of the protrusion body 210 is smaller than a size of the waterproof substrate 100. In this embodiment, a size of the waterproof rib 220 is smaller than the size of the protrusion body 210. In one embodiment, a cross-sectional size of the waterproof rib 220 is smaller than a cross-sectional size of the protrusion body 210. In this embodiment, the waterproof substrate 100, the protrusion body 210 and the waterproof rib 220 all have a certain elasticity.

The above-mentioned waterproof assembly 10 is configured to be provided between the cabinet of the display screen and the display module of the display screen. The waterproof protrusion 200 is easily deformed relative to the waterproof substrate 100 having larger size. When the deformation is large, the waterproof effect is better, so that sealing and waterproof effects may be achieved by squeezing the waterproof protrusion 200 and the display module, or squeezing the waterproof protrusion 200 and cabinet, instead of squeezing the waterproof substrate 100 having larger size and the display module, or squeezing the waterproof substrate 100 having larger size and the cabinet. So, there is no need to use a waterproof rubber ring with thickness similar to the waterproof substrate 100 or even larger than the waterproof substrate 100 as a waterproof assembly 10. As a result, the reverse thrust of the waterproof assembly 10 on the cabinet or the display module is reduced, which facilitates tightly compressing the cabinet and the display module, and ensures the stability of the connection between the cabinet and the display module. Especially when the cabinet and the display module are connected by means of magnetic attraction, the reverse thrust of the waterproof protrusion 200 on the cabinet or the display module is very small, which will not damage the magnetic attraction between the cabinet and the display module. Since it can be sealed and waterproofed only by the waterproof protrusion 200, the thickness of the waterproof substrate 100 may be made relatively small, and there is no need to worry about the problem of poor waterproof effect due to a gap existed at the compression portion because of the insufficient thickness of the waterproof rubber ring. As a result, materials may be saved and manufacturing cost may be reduced, thereby ensuring the waterproof effect. In addition, at least two mutually spaced waterproof ribs 220 are provided on the connecting end surface 211 of the protrusion body 210, and each of the waterproof ribs 220 is inclined outwardly relative to the end surface of the protrusion body 210, so that when the waterproof ribs 220 are squeezed, the waterproof ribs 220 may be further inclined outwardly. When the squeezing force is relatively large, the protrusion body 210 may also be squeezed. Since the waterproof ribs 220 are squeezed to be further inclined in a direction away from each other, it may ensure that the entire waterproof protrusion 200 is squeezed smoothly, so that the protrusion body 210 will not be bent, namely, the waterproof protrusion 200 will not be wrinkled, so that there will not be a gap between the display module and the cabinet, and the sealing and waterproof effects of the waterproof assembly 10 will not be affected.

In order to further improve the waterproof effect of the waterproof assembly 10, in one embodiment, a number of the waterproof protrusions 200 is at least two. In this embodiment, at least two waterproof protrusions 200 are provided on a mounting surface of the waterproof substrate 100. When a plurality of waterproof protrusions 200 are located at one side of the waterproof substrate 100, a multi-layer waterproof effect may be achieved, thereby improving the waterproof effect of the waterproof assembly 10. When the waterproof protrusions 200 are provided on both sides of the waterproof substrate 100, both sides of the waterproof substrate 100 may be sealed and waterproofed by squeezing the waterproof protrusions 200 with the external structure, and the thickness of the waterproof substrate 100 may be reduced, and the production cost may also be reduced. In one embodiment, at least one waterproof protrusion 200 is provided on the two mounting surfaces 110 of the waterproof substrate 100 respectively, namely, each mounting surface 110 is provided with a waterproof protrusion 200 respectively, or each mounting surface 110 is provided with two waterproof protrusions 200 respectively, so that both sides of the waterproof substrate 100 may be sealed and waterproofed with the waterproof protrusions 200, which may further improve the waterproof effect of the waterproof assembly 10, and may reduce the thickness of the waterproof substrate 100 and reduce production costs.

In order to further ensure that the waterproof protrusion 200 is squeezed smoothly, in one embodiment, the waterproof ribs 220 are evenly distributed on the connecting end surface 211 respectively. In this way, when a plurality of waterproof ribs 220 inclined outwardly away from each other are squeezed, the squeezing stability of the entire waterproof protrusion 200 may be further improved, namely, it is further ensured that the waterproof protrusion 200 is further stably squeezed. Bending of the protrusion body 210 may be further avoided, namely, it may further prevent the wrinkle of waterproof substrate 200 from affecting the sealing and waterproof effects of waterproof assembly 10.

In one embodiment, as shown in FIG. 2, the number of the waterproof ribs 220 is two, and the distance between the two waterproof ribs 220 gradually increases in a direction away from the connecting end surface 211, namely, the two waterproof ribs 220 are inclined outwardly in a direction away from the connecting end surface 211, or the two waterproof ribs 220 are inclined facing away from each other in a direction away from the connecting end surface 211. In this embodiment, two waterproof ribs 220 are provided on the connecting end surface 211 of each protruding body 210, and the two waterproof ribs 220 are inclined outwardly, so that a Y-shaped structure is formed between the two waterproof ribs 220 and the protrusion body 210, namely, the cross-section of each waterproof rib 220 and the cross-section of the protrusion body 210 are Y-shaped. In this way, the two waterproof ribs 220 may be inclined further away from each other when being squeezed, which not only ensures the sealing effect of squeezing, but also prevents the protrusion body 210 from being bent due to uneven force.

In one embodiment, the two waterproof ribs 220 are symmetrically arranged, so that the waterproof protrusion 200s are more smoothly squeezed. In one embodiment, the waterproof protrusion 200 is a Y-shaped structure.

Figure 3:
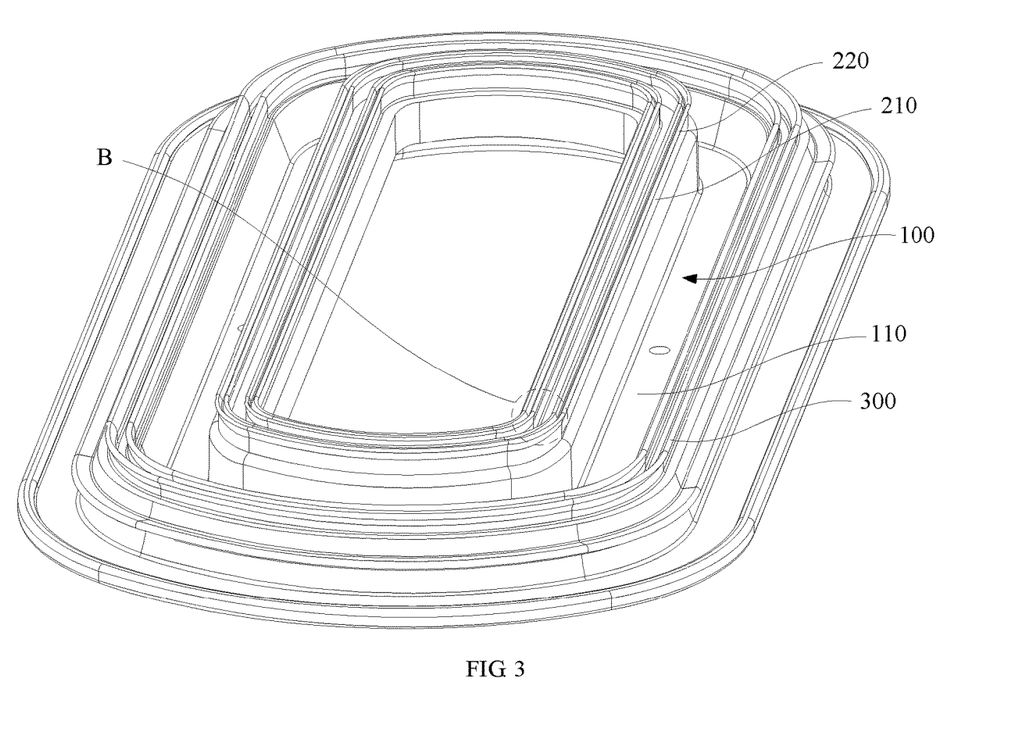
FIG. 3 is a schematic structural view of the waterproof assembly according to another embodiment.
Figure 4:
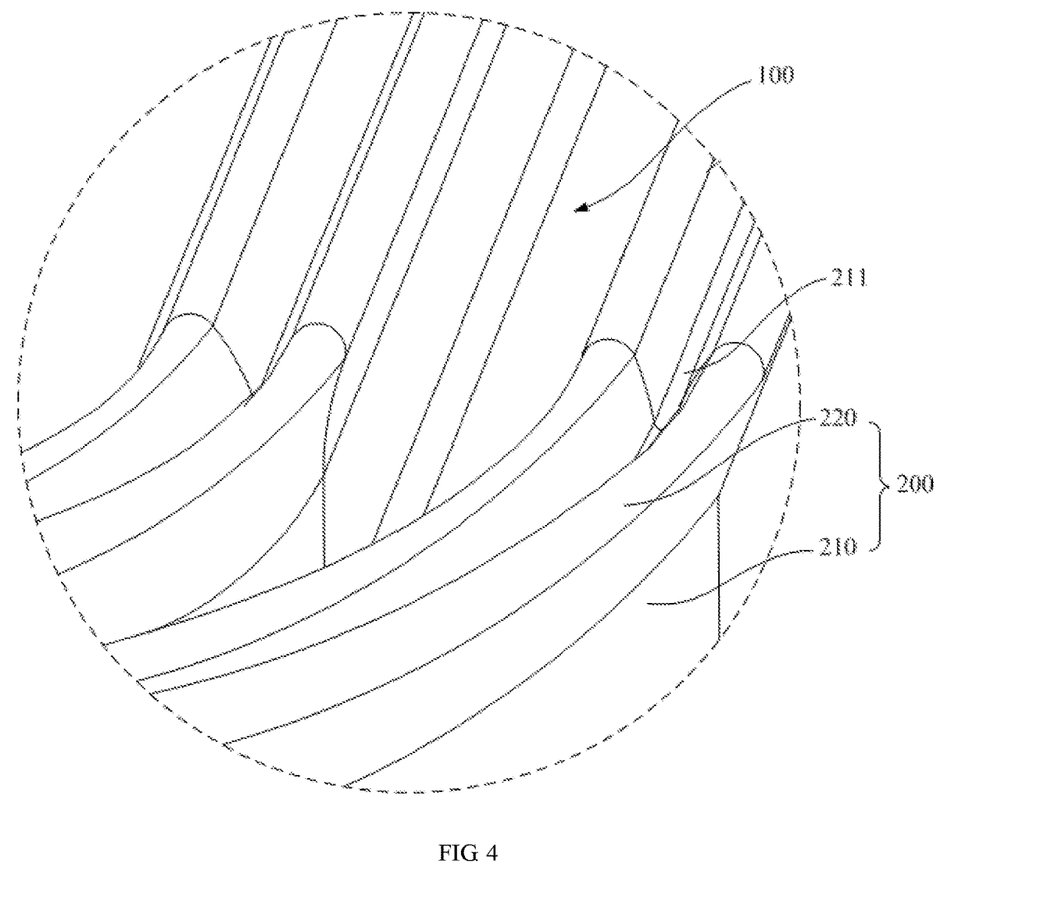
FIG. 4 is a partially enlarged schematic view of a portion B of the waterproof assembly shown in FIG. 3.

In order to make the waterproof protrusion 200 prevent the opening of the external structure from water, in one embodiment, as shown in FIG. 3 and FIG. 4, the protrusion body 210 and the waterproof rib 220 are both ring-shaped structures. The two ring-shaped waterproof ribs 220 are respectively disposed on the ring-shaped protrusion body 210. In this embodiment, the extending direction of the waterproof ribs 220 and the extending direction of the protrusion body 210 are the same. In this way, the ring-shaped protrusion body 210, the ring-shaped waterproof ribs 220 and the waterproof substrate 100 together may form a semi-sealed space. When the waterproof ribs 220 are squeezed by the external structure, a closed space may be formed, which may prevent water from entering the closed space. If the external structure has an opening, the waterproof protrusion 200 may surround the opening, which may prevent the opening from water. For example, when the waterproof ribs 220 are squeezed with the display module, the entire waterproof protrusion 200 may surround the data interface of the display module, which may prevent the data interface of the display module from water. In one embodiment, the waterproof substrate 100 is a ring-shaped structure. A communication opening is defined in the middle of the waterproof substrate 100, and the protrusion body 210 and the waterproof ribs 220 are arranged around the communication opening, so that when the communication opening is communicated with the data interface of the display module, the waterproof protrusion 200 may prevent the data interface of the display module from water when it is squeezed with the display module.

In one embodiment, a plurality of the waterproof protrusions 200 extending in a same direction are provided on the same mounting surface 110 of the waterproof substrate 100, and the plurality of the waterproof protrusions 200 are arranged in ring shapes from inside to outside. In this way, the opening may be prevent from water by the waterproof protrusions 200 from the inside to the outside, and the waterproof effect is better.

In one embodiment, the waterproof rib 220, the waterproof protrusion 200, and the waterproof substrate 100 are integrally formed, so that the overall structure of the waterproof assembly 10 is compact and firm. In this way, the waterproof effect of the waterproof assembly 10 is further improved, and the service life of the waterproof assembly 10 is also improved.

In one embodiment, as shown in FIG. 2, the waterproof assembly 10 further includes at least one waterproof protrusion strip 300, which is provided on at least one mounting surface 110 of the waterproof substrate 100 and is spaced apart from the protrusion body 210. In one embodiment, the waterproof protrusion strip 300 extends in the same direction as the protrusion body 210. In one embodiment, the waterproof protrusion strip 300 is a ring-shape structure. The waterproof protrusion strip 300 cooperates with the waterproof protrusion 200 to form multiple waterproof defense lines, which further improves the waterproof effect of the waterproof assembly 10, and there is no need to arrange the waterproof rib 220 like the waterproof protrusion 200, thereby reducing the manufacturing difficulty.

Figure 5:
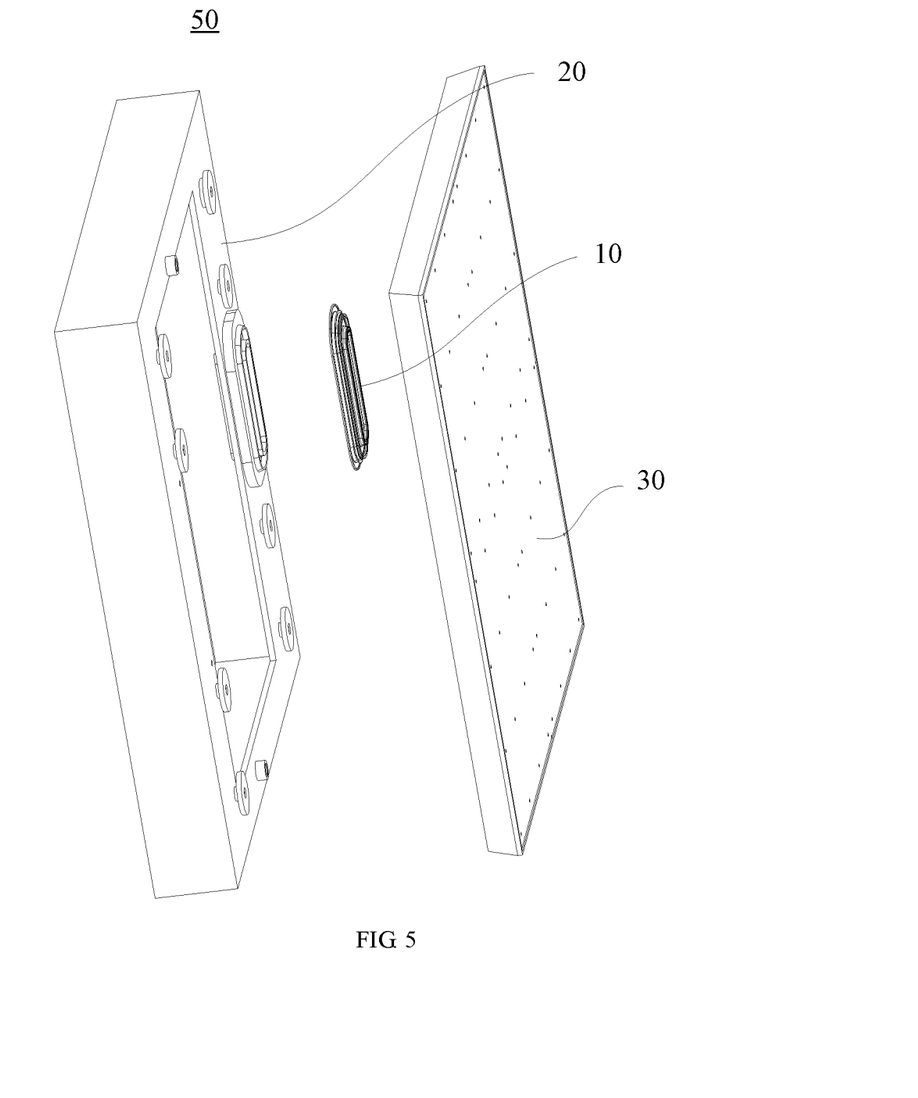
FIG. 5 is a schematic structural view of a display screen according to an embodiment.
Figure 6:
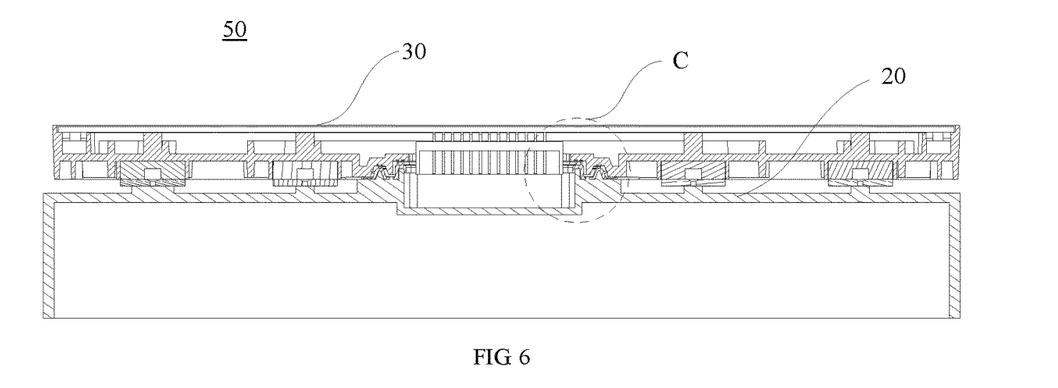
FIG. 6 is another schematic structural view of the display screen according to an embodiment.
Figure 7:
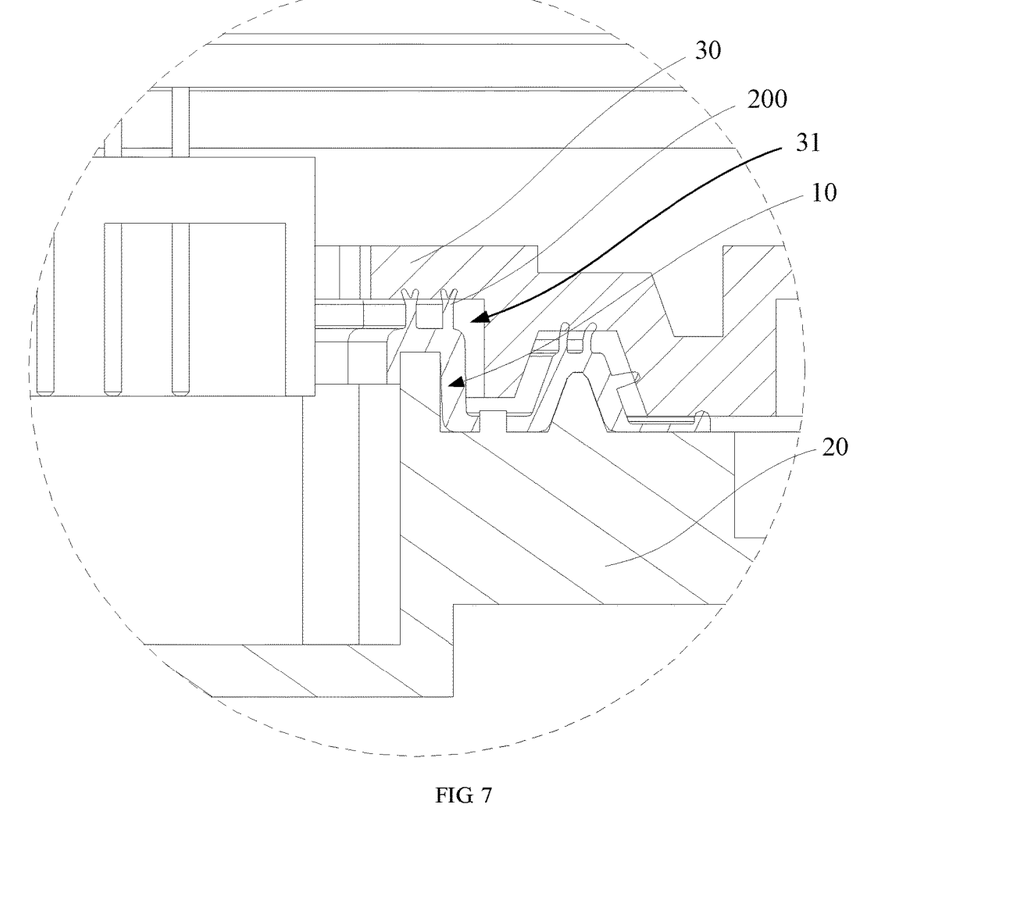
FIG. 7 is a partially enlarged schematic view of a portion C of the display screen shown in FIG. 6.

As shown in FIG. 5 to FIG. 7, the present application further provides a display screen 50, including a cabinet 20 and a display module 30 connected with the cabinet 20, and an installation space is defined between the display module 30 and the cabinet 20. The display screen 50 further includes the waterproof assembly 10 according to any one of the above embodiments. The waterproof assembly 10 is disposed in the installation space. At least one mounting surface 110 of the mounting surface 110 of the waterproof substrate 100 facing the cabinet 20 and the mounting surface 110 of the waterproof substrate 100 facing the display module 30 includes the waterproof protrusion 200. At least one of the cabinet 20 and the display module 30 is abutted against the waterproof ribs 220. In this embodiment, at least one of the cabinet 20 and the display module 30 is connected to the waterproof ribs 220 by squeezing.

The waterproof assembly 10 is provided between the cabinet 20 of the display screen 50 and the display module 30 of the display screen 50. The waterproof protrusion 200 is easily deformed relative to the waterproof substrate 100 having larger size. When the deformation is large, the waterproof effect is better, so that sealing and waterproof effects may be achieved by squeezing the waterproof protrusion 200 and the display module 30, or squeezing the waterproof protrusion 200 and cabinet 20, instead of squeezing the waterproof substrate 100 having larger size and the display module 30, or squeezing the waterproof substrate 100 having larger size and the cabinet 20. So, there is no need to use a waterproof rubber ring with thickness similar to the waterproof substrate 100 or even larger than the waterproof substrate 100 as a waterproof assembly 10. As a result, the reverse thrust of the waterproof assembly 10 on the cabinet 20 or the display module 30 is reduced, which facilitates tightly squeezing the cabinet 20 and the display module 30, and ensures the stability of the connection between the cabinet 20 and the display module 30. Especially when the cabinet 20 and the display module 30 are connected by means of magnetic attraction, the reverse thrust of the waterproof protrusion 200 on the cabinet 20 or the display module 30 is very small, which will not damage the magnetic attraction between the cabinet 20 and the display module 30. Since it can be sealed and waterproofed only by the waterproof protrusion 200, the thickness of the waterproof substrate 100 may be made relatively small, and there is no need to worry about the problem of poor waterproof effect due to a gap existed at the compression portion because of the insufficient thickness of the waterproof rubber ring. As a result, materials may be saved and manufacturing cost may be reduced, thereby ensuring the waterproof effect. In addition, at least two mutually spaced waterproof ribs 220 are provided on the connecting end surface 211 of the protrusion body 210, and each of the waterproof ribs 220 is inclined outwardly relative to the end surface of the protrusion body 210, so that when the waterproof ribs 220 are squeezed, the waterproof ribs 220 may be further inclined outwardly. When the squeezing force is relatively large, the protrusion body 210 may also be squeezed. Since the waterproof ribs 220 are squeezed to be further inclined in a direction away from each other, it may ensure that the entire waterproof protrusion 200 is squeezed smoothly, so that the protrusion body 210 will not be bent, namely, the waterproof protrusion 200 will not be wrinkled, so that there will not be a gap between the display module 30 and the cabinet 20, and the sealing and waterproof effects of the waterproof assembly 10 will not be affected.

In one embodiment, as shown in FIG. 1, FIG. 2, FIG. 6 and FIG. 7, the mounting surface 110 of the waterproof substrate 100 facing the display module 30 includes the waterproof protrusion 200. The display module 30 is abutted against the waterproof ribs 220. The mounting surface 110 of the waterproof substrate 100 facing away from the waterproof protrusion 200 is abutted against the cabinet 20. In this embodiment, the display module 30 is connected with the waterproof ribs 220 by squeezing, and the mounting surface 110 of the waterproof substrate 100 facing away from the waterproof protrusion 200 is connected with the cabinet 20 by squeezing. The squeezing force between the cabinet 20 and the waterproof substrate 100 is substantially equal to the squeezing force between the waterproof ribs 220 and the display module 30. The squeezing force required for the waterproof ribs 220 to deform to achieve sealing and waterproof effects do not need to be too large, so the squeezing force between the cabinet 20 and the waterproof substrate 100 is not large. Therefore, the waterproof substrate 100 will not deform greatly even if the waterproof substrate 100 is elastic. As a result, the reverse thrust of the waterproof substrate 100 is small and will not overcome the magnetic attraction between the cabinet 20 and the display module 30, so that the cabinet 20 may not be pushed away and be separated from the display module 30. Therefore, the waterproof ribs 220 of the waterproof protrusion 200 may be used to achieve good sealing and waterproof effects without affecting the stability of the connection between the cabinet 20 and the display module 30.

In one embodiment, the mounting surface 110 of the waterproof substrate 100 facing the cabinet 20 includes the waterproof protrusion 200. The cabinet 20 is abutted against the waterproof ribs 220. The mounting surface 110 of the waterproof substrate 100 facing away from the waterproof protrusion 220 is abutted against the display module 30. In this embodiment, the cabinet 20 is abutted against the waterproof ribs 220. The mounting surface 110 of the waterproof substrate 100 facing away from the waterproof protrusion 220 is abutted against the display module 30 by squeezing. The squeezing force between the display module 30 and the waterproof substrate 100 is substantially equal to the squeezing force between the waterproof ribs 220 and the cabinet 20. The squeezing force required for the waterproof ribs 220 to deform to achieve sealing and waterproof effects do not need to be too large, so the squeezing force between the display module 30 and the waterproof substrate 100 is not large. Therefore, the waterproof substrate 100 will not deform greatly even if the waterproof substrate 100 is elastic. As a result, the reverse thrust of the waterproof substrate 100 is small and will not overcome the magnetic attraction between the cabinet 20 and the display module 30, so that the display module 30 may not be pushed away and be separated from the cabinet 20. Therefore, the waterproof ribs 220 of the waterproof protrusion 200 may be used to achieve good sealing and waterproof effects without affecting the stability of the connection between the cabinet 20 and the display module 30.

In one embodiment, the mounting surface 110 of the waterproof substrate 100 facing the cabinet 20 and the mounting surface 110 of the waterproof substrate 100 facing the display module 30 are respectively provided with the waterproof protrusion 200. The waterproof ribs 220 provided on one mounting surface 110 of the waterproof substrate 100 is abutted against the display module 30, and the waterproof ribs 220 provided on the other mounting surface 110 of the waterproof substrate 100 is abutted against the cabinet 20. In this embodiment, The waterproof ribs 220 provided on one mounting surface 110 of the waterproof substrate 100 is connected with the display module 30 by squeezing, and the waterproof ribs 220 provided on the other mounting surface 110 of the waterproof substrate 100 is connected with the cabinet 20 by squeezing. In this way, better sealing and waterproof effects of both sides of the waterproof substrate 100 may be achieved by the waterproof protrusion 200 being squeezed with the external structure, thereby further improving the waterproof effect of the waterproof assembly 10, reducing the thickness of the waterproof substrate 100, and reducing the production cost.

In order to facilitate arrangement of the waterproof assembly 10, in one embodiment, at least one of the cabinet 20 and the display module 30 defines an embedded slot 31, and the waterproof assembly 10 is embedded in the embedded slot 31. In this way, it is convenient to arrange the waterproof assembly 10, and the waterproof effect of the waterproof assembly 10 may be improved. In one embodiment, as shown in FIG. 7, the display module 30 defines at least one embedded slot 31, and the waterproof substrate 100 is provided with at least one waterproof protrusion 200 on a side facing the display module 30. Each waterproof protrusion 200 is embedded in an embedded slot 31 respectively and abutted against the bottom of the embedded slot 31. In this embodiment, each waterproof protrusion 200 is embedded in an embedded slot 31 respectively and is connected with the bottom of the embedded slot 31 by squeezing. In this way, the waterproof assembly 10 may be easily arranged, and the sealing and waterproof effects may be achieved by connecting the waterproof protrusion 200 and the bottom of the embedded slot 31 by squeezing.

In one embodiment, the waterproof substrate 100 is a ring-shaped structure. The display module 30 includes a data interface, and the waterproof substrate 100 surrounds the data interface.

Figure 8:
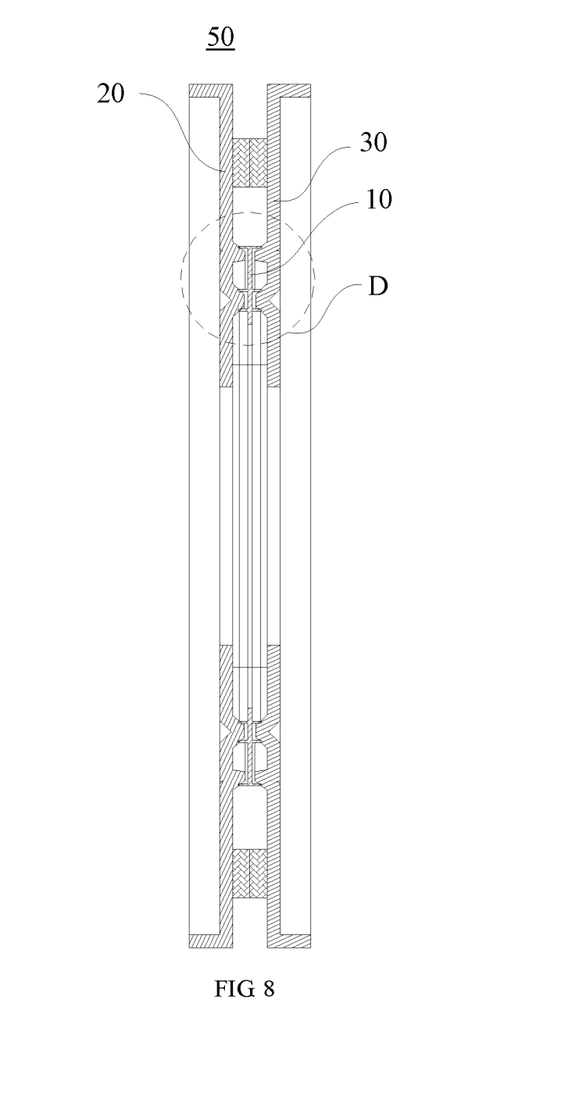
FIG. 8 is a schematic structural view of the display screen according to another embodiment.
Figure 9:
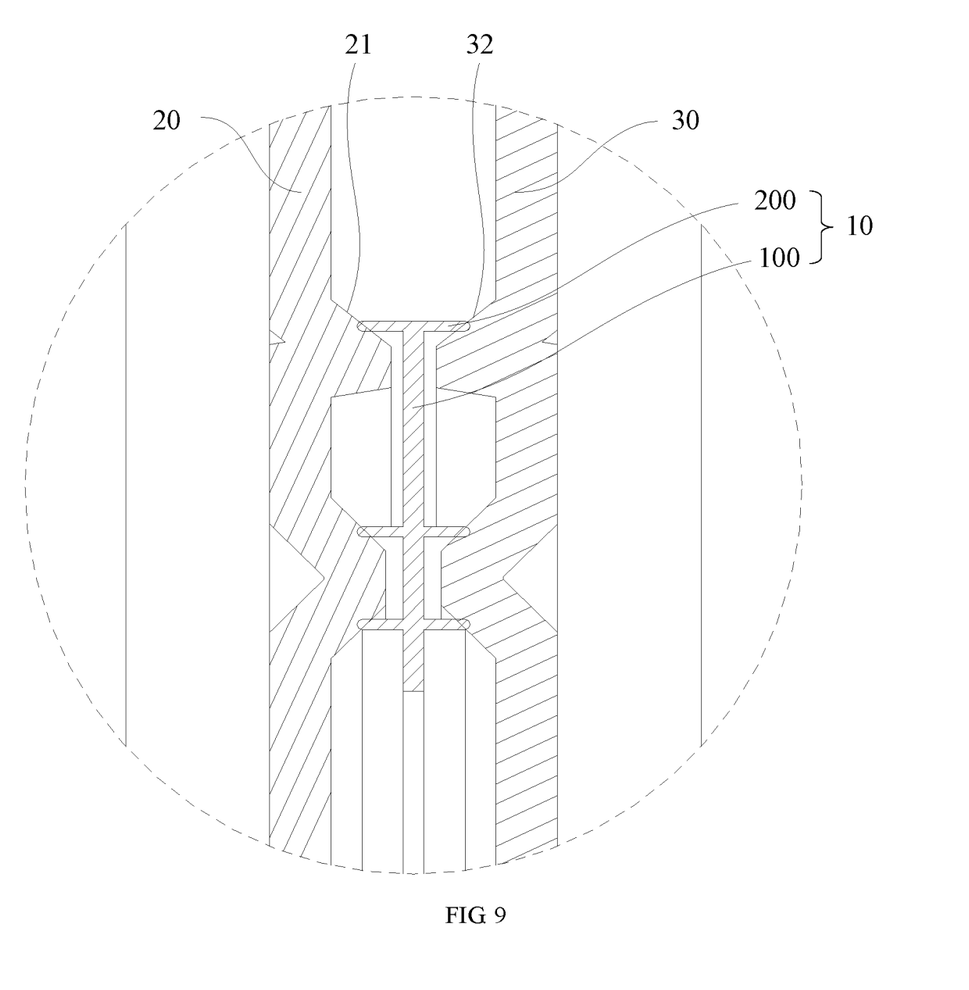
FIG. 9 is a partially enlarged schematic view of a portion D of the display screen shown in FIG. 8.

In one embodiment, as shown in FIGS. 8 and 9, the mounting surface 110 of the waterproof substrate 100 facing the cabinet 20 and the mounting surface 110 of the waterproof substrate 100 facing the display module 30 are provided with the waterproof protrusion 200 respectively. The display module 30 is abutted against the waterproof protrusion 200 provided on one mounting surface 110 of the waterproof substrate 100, and the cabinet 20 is abutted against the waterproof protrusion 200 provided on the other mounting surface 110 of the waterproof substrate 100. A surface of the cabinet 20 in contact with the at least one waterproof protrusion 200 is defined as a first abutting surface 21, and a surface of the display module 30 in contact with the at least one waterproof protrusion 200 is defined as a second abutting surface 32. Namely, the cabinet 20 has the first abutting surface 21 abutted against the waterproof protrusion 200, and the display module 30 has the second abutting surface 32 abutted against the waterproof protrusion 200. At least one of the first abutting surface 21 and the second abutting surface 32 is inclined with respect to the mounting surface 110. In one embodiment, the first abutting surface 21 and the second abutting surface 32 are inclined with respect to the mounting surface 110 respectively. In this way, the end of the waterproof protrusion 200 away from the waterproof substrate 100 and the first abutting surface 21 are not vertically abutted. A better waterproof effect may be achieved when the squeezing force between the waterproof protrusion 200 and the first abutting surface 21 reaches a preset force. When the force between the waterproof protrusion 200 and the inclined first abutting surface 21 is a preset force, it is assumed that the waterproof protrusion 200 is disposed away from the waterproof substrate 100 in the horizontal direction, and the mounting surface 110 is set vertically. The preset force may be decomposed into a first component force in the horizontal direction and a second component force in the vertical direction. Since the first component force is smaller than the preset force, the squeezing force of the waterproof protrusion 200 on the cabinet 20, namely, the first component force becomes smaller. If the first abutting surface 21 is parallel to the mounting surface 110, rather than being inclined with respect to the mounting surface 110, the squeezing force of the waterproof protrusion 200 on the cabinet 20 in the horizontal direction, namely, the first component force may be equal to the preset force. But if the first abutting surface 21 is set as an inclined surface with respect to the mounting surface 110, the squeezing force of the waterproof protrusion 200 on the cabinet 20 in the horizontal direction, namely, the first component force may be smaller to the preset force. Similarly, the abutment of the second abutting surface 32 of the display module 30 and the waterproof protrusion 200 is similar to the abutment of the first abutting surface 21 and the waterproof protrusion 200. Therefore, when the first abutting surface 21 and the second abutting surface 32 are inclined relative to the mounting surface 110 respectively, the squeezing force between the waterproof protrusion 200 and the cabinet 20 and the squeezing force between the waterproof protrusion 200 and the display module 30 become smaller. However, since the squeezing force between the waterproof protrusion 200 and the first abutting surface 21 and the squeezing force between the waterproof protrusion 200 and the second abutting surface 32 remain unchanged, the sealing and waterproof effects of the waterproof protrusion 200 on the display screen 50 may still be guaranteed. In one embodiment, the number of the first abutting surface 21 and the number of the second abutting surface 32 are multiple, and the number of the waterproof protrusion 200 is multiple. Each first abutting surface 21 is abutted against at least one waterproof protrusion 200, and each second abutting surface 32 is abutted against at least one waterproof protrusion 200. In this way, multi-layered sealing and waterproof effects may be achieved, and the squeezing force of each position where the waterproof assembly 10 being abutted against the display module 30 or the cabinet 20 is small, and the sealing and waterproof effects of the waterproof protrusion 200 on the display screen 50 may still be guaranteed.

In one embodiment, the display module 30 is abutted against the waterproof ribs 220 provided on one mounting surface 110 of the waterproof substrate 100, and the cabinet 20 is abutted against the waterproof ribs 220 provided on the other mounting surface 110 of the waterproof substrate 100. A surface of the cabinet 20 in contact with the waterproof ribs 220 is defined as a first abutting surface 21. A surface of the display module 30 in contact with the waterproof ribs 220 is defined as a second abutting surface 32. At least one of the first abutting surface 21 and the second abutting surface 32 is inclined with respect to the connecting end surface 211.

The technical features of the embodiments described above can be arbitrarily combined. In order to simplify the description, all possible combinations of the technical features in the above embodiments have not been described. However, as long as there is no contradiction in the combination of these technical features, it should be considered as the scope described in this specification.

The above-mentioned embodiments only express several implementation manners of the present application, and the description thereof is more specific and detailed, but cannot be understood as a limitation on the scope of the present application. It should be noted that, for those of ordinary skill in the art, without departing from the concept of the present application, several modifications and improvements can be made, and these all belong to the protection scope of the present application. Therefore, the protection scope of the present application shall be subject to the appended claims.

What is claimed is:

1. A waterproof assembly, comprising:
a waterproof substrate comprising:
two mounting surfaces, wherein one of the two mounting surfaces is on an upper side of a seal and the other of the two mounting surfaces is on a bottom side of the seal; and
at least one waterproof protrusion protruded from at least one of the two mounting surfaces and comprising:
a protrusion body connected with the mounting surface on the upper side of the seal, one end of the protrusion body away from the waterproof substrate comprising a connecting end surface; and
at least two waterproof ribs, each of the waterproof ribs being protruded from the connecting end surface respectively and being gradually inclined outwardly in a direction away from the connecting end surface respectively;
at least one waterproof protrusion strip provided on at least one of the two mounting surfaces of the waterproof substrate, spaced apart from the protrusion body, and extending in the same direction as the protrusion body.

2. The waterproof assembly according to claim 1, wherein the waterproof ribs are evenly distributed on the connecting end surface respectively; and the at least one waterproof protrusion strip cooperates with the at least one waterproof protrusion to form multiple waterproof defense lines.

3. A display screen, comprising a cabinet and a display module connected with the cabinet, an installation space being defined between the display module and the cabinet, wherein the display screen further comprises:
a waterproof assembly according to claim 1,
wherein:
the waterproof assembly is disposed in the installation space;
a mounting surface of the waterproof substrate facing the cabinet and a mounting surface of the waterproof substrate facing the display module comprises the at least one waterproof protrusion; and
at least one of the cabinet and the display module is abutted against the at least two waterproof ribs.

4. The display screen according to claim 3, wherein:
the display module is abutted against the at least two waterproof ribs; and
the mounting surface of the waterproof substrate facing away from the at least one waterproof protrusion is abutted against the cabinet.

5. The display screen according to claim 3, wherein:
the cabinet is abutted against the at least two waterproof ribs; and
the mounting surface of the waterproof substrate facing away from the at least one waterproof protrusion is abutted against the display module.

6. The display screen according to claim 3, wherein:
the mounting surface of the waterproof substrate facing the cabinet and the mounting surface of the waterproof substrate facing the display module are respectively provided with the at least one waterproof protrusion;
the waterproof ribs provided on one mounting surface of the waterproof substrate is abutted against the display module; and
the waterproof ribs provided on the other mounting surface of the waterproof substrate is abutted against the cabinet.

7. The display screen according to claim 3, wherein at least one of the cabinet and the display module defines an embedded slot, the waterproof assembly being embedded in the embedded slot.

8. The display screen according to claim 3, wherein the display module comprises:
a data interface;
wherein:
the waterproof substrate is a ring-shaped structure and surrounds the data interface.

9. The display screen according to claim 3, wherein:
a surface of the cabinet in contact with the at least one waterproof protrusion is defined as a first abutting surface;
a surface of the display module in contact with the at least one waterproof protrusion is defined as a second abutting surface; and
at least one of the first abutting surface and the second abutting surface is inclined with respect to the mounting surface.

10. The display screen according to claim 9, wherein the first abutting surface and the second abutting surface are inclined with respect to the mounting surface respectively.

11. The display screen according to claim 3, wherein the waterproof ribs are evenly distributed on the connecting end surface respectively.

12. The display screen according to claim 3, wherein:
a distance between the two waterproof ribs gradually increases in the direction away from the connecting end surface.

\* \* \* \* \*